United States Patent
Engel et al.

(10) Patent No.: US 8,901,924 B2
(45) Date of Patent: Dec. 2, 2014

(54) APPARATUS AND METHOD FOR SEQUENTIALLY RESETTING ELEMENTS OF A MAGNETIC SENSOR ARRAY

(75) Inventors: Bradley Engel, Chandler, AZ (US); Phillip Mather, Phoenix, AZ (US)

(73) Assignee: EverSpin Technologies, Inc., Chandler, AZ (US)

(*) Notice: Subject to any disclaimer, the term of this patent is extended or adjusted under 35 U.S.C. 154(b) by 633 days.

(21) Appl. No.: 13/031,558

(22) Filed: Feb. 21, 2011

(65) Prior Publication Data
US 2012/0212217 A1  Aug. 23, 2012

(51) Int. Cl.
*G01R 33/02* (2006.01)
*G01R 33/09* (2006.01)
*B82Y 25/00* (2011.01)

(52) U.S. Cl.
CPC ............ *G01R 33/098* (2013.01); *G01R 33/093* (2013.01); *B82Y 25/00* (2013.01); *G01R 33/09* (2013.01)
USPC ...... 324/252; 324/126; 324/249; 324/207.21; 324/750.21; 324/754.17

(58) Field of Classification Search
CPC .... G01R 33/093; G01R 33/096; G01R 33/09; G01R 33/07; G01R 33/0017; G01R 33/0029; G01R 29/0878; G01D 5/14; G01D 5/145; G06K 7/08; G06K 7/082; G01L 3/101; H03K 17/9517
USPC ............... 324/126, 249, 252, 207.21, 750.21, 324/754.17
See application file for complete search history.

(56) References Cited

U.S. PATENT DOCUMENTS

| | | | |
|---|---|---|---|
| 5,351,005 A | 9/1994 | Rouse et al. | |
| 7,449,882 B2 * | 11/2008 | Witcraft et al. | 324/252 |
| 7,796,028 B1 * | 9/2010 | Kotter et al. | 340/539.22 |
| 8,242,776 B2 * | 8/2012 | Mather et al. | 324/249 |
| 8,390,283 B2 * | 3/2013 | Mather et al. | 324/252 |
| 2006/0132125 A1 | 6/2006 | Withanawasam | |
| 2007/0262773 A1 | 11/2007 | Witcraft et al. | |
| 2008/0258722 A1 | 10/2008 | Zon et al. | |
| 2009/0243607 A1 * | 10/2009 | Mather et al. | 324/249 |
| 2010/0237859 A1 | 9/2010 | Kotter et al. | |
| 2011/0074406 A1 * | 3/2011 | Mather et al. | 324/252 |
| 2013/0106410 A1 * | 5/2013 | Liu et al. | 324/246 |

* cited by examiner

*Primary Examiner* — Patrick Assouad
*Assistant Examiner* — Sean Curtis
(74) *Attorney, Agent, or Firm* — Ingrassia Fisher & Lorenz, P.C.

(57) ABSTRACT

A semiconductor process and apparatus provide a high-performance magnetic field sensor with three differential sensor configurations which require only two distinct pinning axes, where each differential sensor is formed from a Wheatstone bridge structure with four unshielded magnetic tunnel junction sensor arrays, each of which includes a magnetic field pulse generator for selectively applying a field pulse to stabilize or restore the easy axis magnetization of the sense layers to orient the magnetization in the correct configuration prior to measurements of small magnetic fields. The field pulse is sequentially applied to groups of the sense layers of the Wheatstone bridge structures, thereby allowing for a higher current pulse or larger sensor array size for maximal signal to noise ratio.

21 Claims, 8 Drawing Sheets

APPARATUS AND METHOD FOR SEQUENTIALLY RESETTING ELEMENTS OF A MAGNETIC SENSOR ARRAY

TECHNICAL FIELD

The exemplary embodiments described herein generally relate to the field of magnetoelectronic devices and more particularly to CMOS compatible magnetoelectronic field sensors used to sense magnetic fields.

BACKGROUND

Sensors are widely used in modern systems to measure or detect physical parameters, such as position, motion, force, acceleration, temperature, pressure, etc. While a variety of different sensor types exist for measuring these and other parameters, they all suffer from various limitations. For example, inexpensive low field sensors, such as those used in an electronic compass and other similar magnetic sensing applications, generally are anisotropic magnetoresistance (AMR) based devices. In order to arrive at the required sensitivity and reasonable resistances that mesh well with CMOS, the sensing units of such sensors are generally on the order of square millimeters in size. For mobile applications, such AMR sensor configurations are too costly, in terms of expense, circuit area, and power consumption.

Other types of sensors, such as magnetic tunnel junction (MTJ) sensors and giant magnetoresistance (GMR) sensors, have been used to provide smaller profile sensors, but such sensors have their own concerns, such as inadequate sensitivity and being effected by temperature changes. To address these concerns, MTJ, GMR, and AMR sensors have been employed in a Wheatstone bridge structure to increase sensitivity and to eliminate temperature dependent resistance changes. For minimal sensor size and cost, MTJ or GMR elements are preferred. Typically, a Wheatstone bridge structure uses magnetic shields to suppress the response of reference elements within the bridge so that only the sense elements (and hence the bridge) respond in a predetermined manner. However, the magnetic shields are thick and their fabrication requires carefully tuned NiFe seed and plating steps. Another drawback associated with magnetic shields arises when the shield retains a remnant field when exposed to a strong (~5 kOe) magnetic field, since this remnant field can impair the low field measuring capabilities of the bridge structure. To prevent the use of magnetic shields, a Wheatstone bridge structure may include two opposite anti-ferromagnetic pinning directions for each sense axis, resulting in four different pinning directions which must be individually set for each wafer, very often requiring complex and unwieldy magnetization techniques. There are additional challenges associated with using MTJ sensors to sense the earth's magnetic field, such as accounting for variations in the measured field caused by Barkhausen noise, sporadic depinning, and jumps of micro-magnetic domains as the sense element responds to an applied field. Prior solutions have attempted to address these challenges by pinning the ends of the sense element in the MTJ sensor, either through a hard magnetic bias layer or an anti-ferromagnetic pinning layer, or by applying a field along the easy axis of the sense element during measurement. These solutions add processing cost/complexity and/or consume additional power during measurement.

Accordingly, it is desirable to provide a magnetoelectronic sensor and method that is adaptable for measuring various physical parameters. There is also a need for a simple, rugged and reliable sensor that can be efficiently and inexpensively constructed as an integrated circuit structure for use in mobile applications. There is also a need for an improved magnetic field sensor and method to overcome the problems in the art, such as outlined above. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A field sensor is configured for resetting sense elements prior to measurement of a field. The field sensor comprises a first bridge circuit including a first plurality of magnetic elements configured to sense a field in a first dimension, the first plurality including i groups of magnetic elements where i is greater than or equal to 2; and circuitry configured to apply a current pulse sequentially to and adjacent to each of the i groups and thereby configuring the field sensor for measurement of the field in the first dimension In yet another field sensor, a first bridge circuit includes a first plurality of magnetic elements configured to sense a field in a first direction, the first plurality including at least a first and second group of magnetic elements; a first conductive line positioned adjacent the first group; a second conductive line positioned adjacent the second group; a second bridge circuit including a second plurality of magnetic elements configured to sense the field in a second direction, the second plurality including at least a third and fourth group of magnetic elements; a third conductive line positioned adjacent the third group; a fourth conductive line positioned adjacent the fourth group; a third bridge circuit including a third plurality of magnetic elements configured to sense a field in a third direction, the third plurality including at least a fifth and sixth group of magnetic elements; a fifth conductive line positioned adjacent the fifth group; a sixth conductive line positioned adjacent the sixth group; and circuitry configured to apply a current pulse sequentially to each of the first through sixth conductive lines and thereby configuring the field sensor for measurement of the components of the field in the first, second, and third directions.

In a method of resetting a field sensor, applying a first current pulse to a first reset line positioned adjacent each of a first group of magnetic elements within a first bridge circuit; and subsequently applying a second current pulse to a second reset line positioned adjacent each of a second group of magnetic elements within the first bridge circuit.

BRIEF DESCRIPTION OF THE DRAWINGS

The present invention will hereinafter be described in conjunction with the following drawing figures, wherein like numerals denote like elements.

DETAILED DESCRIPTION

Figure 1:
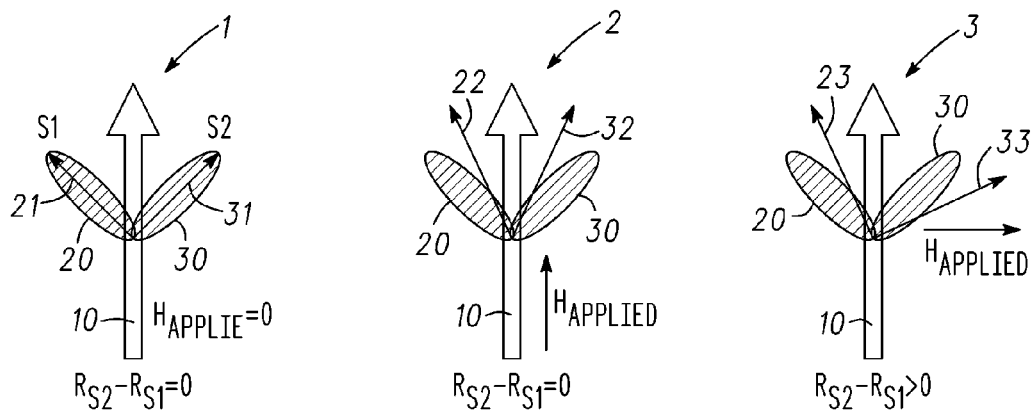
FIG. 1 illustrates two active sense elements having magnetizations that are angled equally in different directions from a pinned layer that will deflect in response to an externally applied magnetic field and provide an output signal related to the component of the magnetic field that is not aligned with the pinning direction of the pinned layer.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

A method and apparatus are described for a differential sensor array in which sense elements formed over pinned layers are dynamically stabilized with an aligning field pulse that is sequentially applied periodically (e.g., during each measurement cycle) to groups of the differential sensor array. Using shape anisotropy, the shapes of two sense elements arrays may be formed to have magnetizations that are angled equally in different directions from a single magnetization direction of the pinned layer so that the sense layers will deflect in response to an externally applied magnetic field. With this configuration, a single axis magnetic sensor may be formed from a single pinning direction, or a compass circuit may be formed from three such differential sensors circuits so that only two pinning directions are required for the entire three axis compass, thereby simplifying and reducing the manufacturing cost and complexity. In an example implementation, each differential sensor circuit is constructed as a Wheatstone bridge structure in which four arrays of unshielded active sense elements are used to detect and measure an externally applied magnetic field. To address field fluctuations that can impair the field response of a sense element, the sensor layers may be dynamically stabilized by applying a field pulse either before each field measurement or at a predetermined interval to prepare the magnetic sensor, thereby eliminating the need for any hard bias layer(s) to stabilize the sense elements. Without such hard bias stabilization or a measurement preparation capability, a momentary exposure to a large field may reorient the magnetization of the sense elements in a poorly determined state. The sense array is optimally sized for highest possible signal-to-noise (SNR) while allowing the available voltage supply to stabilize the sensors with the required current during the measurement phase. For the smallest possible physical array size, and hence the lowest cost, a single copper line (or parallel connected series of line segments) is routed underneath each sense element. In the stabilization (or measurement) phase, each of these line segments is connected in series so that each sense element has the identical stabilization field and hence identical sensor response. Therefore, the array averaging is precise and SNR is increased the maximal amount for a given array size. To prepare the sense elements for field measurement, an orienting field pulse is applied along the stabilization path. For this operation, the stabilization line is broken into groups of segments that may be connected sequentially to the available voltage source, wherein isolated combinations of the groups of segments may be optionally reset in parallel. The orienting current pulse train then proceeds sequentially down a reset/stabilization line that is placed proximal to the sense elements and the groups of sense elements are prepared for measurement. As all the groups in each sense axis must be properly configured (oriented) for measurement of that axis, this orientation procedure must be applied at some point between a high field exposure and before each axis proceeds to the measurement phase. All sense axes may be reset together, or a reset may be applied before each individual axis is measured. This reset may be periodic, precede each measurement, or only occur when an error condition (very high bridge offset indicating misorientation, linearity errors, or high noise condition) is encountered. As the individual sense element anisotropy is large compared with the stabilization field that must be applied for noise optimization but on the same order as the field required to reorient the sense element, the magnitude of the orientation field pulse is much large than that applied during the measurement phase for sensor stabilization. Therefore, the available voltage is insufficient to reset an array that is sized for maximal SNR. In order to have sufficient voltage, the preparation phase described herein is a sequential series of orientation pulses, wherein each pulse treats a different subsection of the array. The pulse duration is very short, preferably 20 ns or less, and hence in this manner all sense elements across all bridges may be prepared for measurement in an extremely short time window. Subsequent to the preparation phase, all line segments within a bridge or sense axis are connected in series, and stabilization current is applied to these segments and a measurement may proceed.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. In addition, selected aspects are depicted with reference to simplified cross sectional drawings without including every device feature or geometry in order to avoid limiting or obscuring the present invention. It is also noted that, throughout this detailed description, conventional techniques and features related to magnetoresistive Random Access Memory (MRAM) design, MRAM operation, semiconductor device fabrication, and other aspects of the integrated circuit devices may not be described in detail herein. While certain materials will be formed and removed to fabricate the integrated circuit sensors as part of an existing MRAM fabrication process, the specific procedures for forming or removing such materials are not detailed below since such details are well known and not considered necessary to teach one skilled in the art of how to make or use the present invention. Furthermore, the circuit/component layouts and configurations shown in the various figures contained herein are intended to represent exemplary embodiments of the invention. It should be noted that many alternative or additional circuit/component layouts may be present in a practical embodiment.

It will be appreciated that additional processing steps will be used to fabricate of MTJ sensor structures. As examples, one or more dielectric, ferromagnetic and/or conductive layers may be deposited, patterned and etched using well known techniques, along with conventional backend processing (not depicted), typically including formation of multiple levels of interconnect that are used to connect the sensor structures in a desired manner to achieve the desired functionality. Thus, the specific sequence of steps used to complete the fabrication of the sensor structures may vary, depending on the process and/or design requirements.

The disclosed fabrication process may be used to form a magnetic field sensor from two differential sensor configurations for a single axis response, with only a single pinned direction. For two axis (X,Y) magnetic field response, the sensor only requires two distinct pinning axes, where each differential sensor is formed from a bridge structures with unshielded magnetic tunnel junction (MTJ) sensors. For a third axis (Z), no additional pinning direction is required. The distinct pinning axes may be obtained using shape anisotropy of differently shaped pinning layers in combination with a carefully selected anneal process, or by forming two distinct pinning layers which are separately set and annealed. In a given differential sensor formed from MTJ sensors connected in a bridge circuit, shape anisotropy may be used to create sense elements having different magnetizations at zero field that are angled at different orientations from the magnetization of the pinned layer, for example, at negative 45 degrees and positive 45 degrees. In this configuration, an applied field that includes a component that is orthogonal to the pinning direction will change the magnetization of the different sense layers differently, and as a result, the differential sensor is able to measure the projection of the applied field perpendicular to the pinned axis. The disclosed fabrication process also forms a field conductor below and optionally above each MTJ sensor that may be used to apply a field pulse along the easy axis of the sense layers to prepare the sensor for measurement, and a smaller current to stabilize the sensor during measurement if desired.

Turning now to FIG. 1, a sensor structure 1 is shown in simplified schematic form which uses two active sense element types 20, 30 and a pinned layer 10 to measure an external magnetic field. As depicted, the magnetization directions 21, 31 of the active sense elements 20, 30 are angled equally and in different directions from the magnetization direction of a pinned layer 10. To this end, the sense elements 20, 30 may be formed so that the shape of each sense element is elongated (i.e., longer) in the direction of the desired magnetization for that sense element. Thus shaped, the sense elements 20, 30 use their shape anisotropy to create magnetization directions that are offset from the pinned layer 10. For example, the first sense element 20 may be formed so that its preferred magnetization direction is angled at −45 degrees from the magnetization direction of the pinned layer 10, and with the second sense element 30 so that its preferred magnetization direction is angled at 45 degrees from the magnetization direction of the pinned layer 10, although other offset angles may be used.

Because the resistance/conductance across a sense element and pinned layer depends on the cosine of the angle between the sense element and the pinned layer, the resistance/conductance of the sensor structure can be changed by applying an external magnetic field (H) which deflects the magnetization of the sensor elements 20, 30. For example, if there is no applied field (H=0) to a sensor structure 1, then the magnetization directions 21, 31 of the sense elements 20, 30 are unchanged, and there is no difference between the resistance/conductance of the first and second sensor elements 20, 30. And if an external field H is applied to a sensor structure 2 that is directed along or anti-parallel to the pinned layer 10, the applied field will deflect or rotate the magnetic moments 22, 32 of the sensor elements 20, 30 equally, resulting in equal resistance/conductance changes for each sense element, and hence no change in their difference. However, when an external field H is applied to a sensor structure 3 that is orthogonal to the pinned layer 10, the magnetic moments 23, 33 for each sense element 20, 30 are changed differently in response to the applied field. For example, when the external field H shown in FIG. 1 is directed to the right, the resistance/conductance of the first sense element 20 is reduced, while the resistance/conductance of the second sense element 30 is increased, resulting in a difference signal that is related to the field strength. In this way, the depicted sensor structure measures the projection of the applied field perpendicular to the pinned axis, but not parallel to it.

Figure 2:
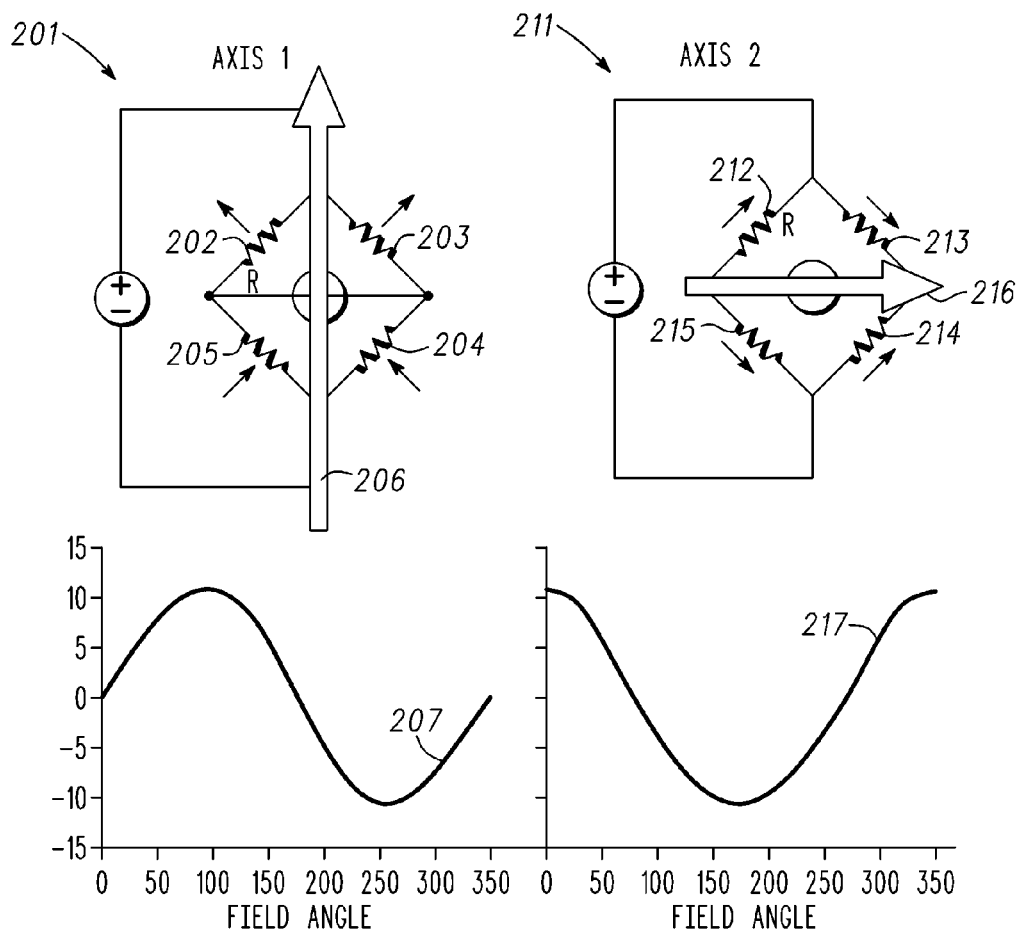
FIG. 2 illustrates an electronic compass structure which uses differential sensors formed from two bridge structures with unshielded MTJ sensors, along with the circuit output for each bridge structure.

FIG. 2 shows first and second sensors 201, 211 for detecting the component directions of an applied field along a first y-axis (Axis 1) and a second x-axis (Axis 2), respectively. As depicted, each sensor is formed with unshielded sense elements that are connected in a bridge configuration. Thus, the first sensor 201 is formed from the connection of sense elements 202-205 in a bridge configuration over a pinned layer 206 that is magnetized in a first direction. In similar fashion, the second sensor 211 is formed from the connection of sense elements 212-215 in a bridge configuration over a pinned layer 216 that is magnetized in a second direction that is perpendicular to the magnetization direction of the pinned layer 206. In the depicted bridge configuration 201, the sense elements 202, 204 are formed to have a first magnetization direction and the sense elements 203, 205 are formed to have a second magnetization direction, where the first and second magnetization directions are orthogonal with respect to one another and are oriented to differ equally from the magnetization direction of the pinned layer 206. As for the second bridge configuration 211, the sense elements 212, 214 have a first magnetization direction that is orthogonal to the second magnetization direction for the sense elements 213, 215 so that the first and second magnetization directions are oriented to differ equally from the magnetization direction of the pinned layer 216. In the depicted sensors 201, 211, there is no shielding required for the sense elements, nor are any special reference elements required. In an example embodiment, this is achieved by referencing each active sense element (e.g., 202, 204) with another active sense element (e.g., 203, 205) using shape anisotropy techniques to establish the easy magnetic axes of the referenced sense elements to be deflected from each other by 90 degrees.

By positioning the first and second sensors 201, 211 to be orthogonally aligned with the orthogonal sense element orientations in each sensor being deflected equally from the sensor's pinning direction, the sensors can detect the component directions of an applied field along the first and second axes. This is illustrated in FIG. 2 with the depicted circuit simulation shown below each sensor. In each simulation, the simulated bridge output 207, 217 is a function of an applied field angle for sense elements with an anisotropy field of 10 Oe, applied field of 0.5 Oe, and a magnetoresistance of 100% when the sense element switches from an anti-parallel state to a parallel state. The simulated bridge outputs can be used to uniquely identify any orientation of the applied external field. For example, a field that is applied with a 0 degree field angle (e.g., pointing "up" so that it is aligned with the y-axis or Axis 1) will generate a bridge output of 0 mV/V from the first sensor 201, and will generate a bridge output of 10 mV/V from the second sensor 201. Conversely, a field that is applied in the opposite direction (e.g., pointing "down" so that it is aligned with a 180 degree field angle) will generate a bridge output of 0 mV/V from the first sensor 201, and will generate a bridge output of −10 mV/V from the second sensor 201.

As seen from the foregoing, a magnetic field sensor may be formed from differential sensors 201, 211 which use unshielded sense elements 202-205, 212-215 connected in a bridge configuration over respective pinned layers 206, 216 to detect the presence and direction of an applied magnetic field. With this configuration, the possibility of residual magnetic moment present in magnetic shielding is eliminated. In addition, the magnetic field sensor provides good sensitivity, and also provides the temperature compensating properties of a bridge configuration. By eliminating the need to form magnetic shielding layers, the manufacturing complexity and cost is reduced and the size of the sensor structure is decreased (in terms of eliminating the silicon real estate required to form any shielding layers). There are also performance benefits to using unshielded sense elements since the magnetic remnance problem is eliminated by removing the magnetic shielding layers.

Figure 3:
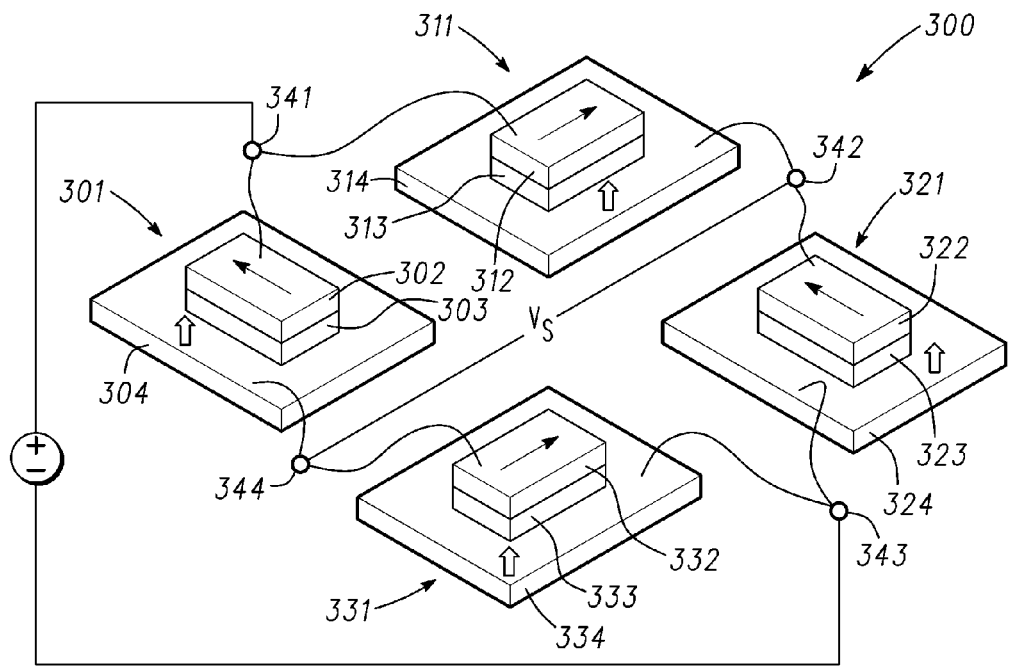
FIG. 3 is a simplified schematic perspective view of a Wheatstone bridge circuit in which series-connected MTJ sensors are aligned to have different magnetization directions from the magnetization direction of the pinned layer.

FIG. 3 provides a simplified schematic perspective view of an example field sensor 300 formed by connecting four MTJ sensors 301, 311, 321, 331 in a Wheatstone bridge circuit, where the series-connected MTJ sensors 301, 311, 321, 331 are formed with sense layers 302, 312, 322, 332 that are aligned to have different magnetization directions from the magnetization direction of the pinned layers 304, 314, 324, 334. The depicted sensor 300 is formed with MTJ sensors 301, 311, 321, 331 that may be manufactured as part of an existing MRAM manufacturing process with only minor adjustments to control the orientation of the magnetic field directions for different layers. In particular, each MTJ sensor 301, 311, 321, 331 includes a first pinned electrode 304, 314, 324, 334, an insulating tunneling dielectric layer 303, 313, 323, 333, and a second sense electrode 302, 312, 322, 332. The pinned and sense electrodes are desirably magnetic materials, for example, and not intended to be limiting, NiFe, CoFe, Fe, CoFeB and the like, or more generally, materials whose magnetization can be collectively aligned. Examples of suitable electrode materials and arrangements are the materials and structures commonly used for electrodes of magnetoresistive random access memory (MRAM) devices, which are well known in the art and contain, among other things, ferromagnetic materials. The pinned and sense electrodes may be formed to have different coercive force or field requirements. The coercive field is basically the amount of field that is required to reverse the magnet from one direction to another after saturation. Technically, it is the magnetic field required to return the magnetization of the ferromagnet to zero after it has been saturated. For example, the pinned electrodes 304, 314, 324, 334 may be formed with an anti-ferromagnetic film exchange coupled to a ferromagnetic film to with a high coercive field so that their magnetization orientation can be pinned so as to be substantially unaffected by movement of an externally applied magnetic field. In contrast, the sense electrodes 302, 312, 322, 332 may be formed with a magnetically soft material to provide different anisotropy axes having a comparatively low coercive force so that the magnetization orientation of the sense electrode (in whatever direction it is aligned) may be altered by movement of an externally applied magnetic field. In selected embodiments, the coercive field for the pinned electrodes is about two orders of magnitude larger than that of sense electrodes, although different ratios may be used by adjusting the respective coercive fields of the electrodes using well known techniques to vary their composition and/or pinning strength.

As shown in FIG. 3, the pinned electrodes 304, 314, 324, 334 in the MTJ sensors are formed to have a first exemplary anisotropy axis alignment in the plane of the pinned electrode layers 304, 314, 324, 334 (identified by the vector arrows pointing toward the top of the drawing of FIG. 3). As described herein, the anisotropy axis alignment for the pinned electrodes 304, 314, 324, 334 may be obtained using shape anisotropy of the pinned electrodes, in which case the shapes of the pinned electrodes 304, 314, 324, 334 would each be longer in the direction of the "up" vector arrow for a single layer pinned magnetic stack. In addition or in the alternative, the anisotropy axis alignment for the pinned electrodes 304, 314, 324, 334 may be obtained by forming one or more magnetic layers in the presence of a saturating magnetic field that is subsequently or concurrently annealed and then cooled so that the magnetic field direction of the pinned electrode layers is set in the direction of the saturating magnetic field. As will be appreciated, the formation of the anisotropy axis alignment for the pinned electrodes 304, 314, 324, 334 must be reconciled with the fabrication steps used to form any other field sensors which include pinned electrodes having a distinct anisotropy axis alignment, as well as any fabrication steps used to form any sense electrodes having a distinct anisotropy axis alignment.

The depicted field sensor 300 also includes MTJ sensors 301, 321 in which sense electrodes 302, 322 are formed to have an exemplary anisotropy axis (identified by the left-pointing vector arrows) that is offset from the anisotropy axis of the pinned electrodes by a first deflection angle. In addition, the depicted field sensor 300 includes MTJ sensors 311, 331 in which sense electrodes 312, 332 are formed to have an exemplary anisotropy axis (identified by the right-pointing vector arrows) that is offset from the anisotropy axis of the pinned electrodes by a second deflection angle which is equal but opposite to the first deflection angle. In a particular embodiment, the first deflection angle is perpendicular to the second deflection angle so that anisotropy axis of the sense electrodes 302, 322 is rotated negative 45 degrees with respect to the anisotropy axis of the pinned electrodes, and so that anisotropy axis of the sense electrodes 312, 332 is rotated positive 45 degrees with respect to the anisotropy axis of the pinned electrodes.

As will be appreciated, the MTJ sensors 301, 311, 321, 331 may be formed to have identical structures that are connected as shown in series by metal interconnections in a standard Wheatstone bridge circuit configuration with both power supply terminals 341, 343 and output signal terminals 342, 344 for the bridge circuit being shown. By connecting in series the unshielded MTJ sensors 301, 311, 321, 331 in a Wheatstone bridge circuit, the field sensor 300 detects the horizontal direction (left to right in FIG. 3) component of an externally applied magnetic field, thereby forming an X-axis sensor bridge. In particular, a horizontal field component would deflect the magnetization of the sense electrodes 302, 322 differently from the deflection of the magnetization of the sense electrodes 312, 332, and the resulting difference in sensor conductance/resistance would quantify the strength of the horizontal field component. Though not shown, a Y-axis sensor bridge circuit may also be formed with unshielded MTJ sensors connected in a Wheatstone bridge circuit configuration, though the anisotropy axis of the pinned electrodes in the Y-axis sensor bridge circuit would be perpendicular to the anisotropy axis of the pinned electrodes 304, 314, 324, 334 in the X-axis sensor bridge. Each of these sensors (or bridge legs) 301, 311, 321, 331 may represent an array of sense elements working in concert to increase the overall SNR of the system.

Low field magnetic sensors are susceptible to Barkhausen noise, sporadic de-pinning, jumps of micro-magnetic domains (resulting from different regions in the magnetic sense element that may have slightly different orientations of their local magnetic moment from in weak local pinning that is caused by edge roughness caused by small local inhomogeneities in the sense layer), or a myriad of other sources. Such noise can introduce errors in accurately measuring the angular resolution of the Earth's magnetic field. When a field is applied, these micro-magnetic domains may reverse in a sequential fashion in lieu of the desired coherent rotation of the sense element. Prior attempts to address such noise have used a hard magnetic bias layer in the sense layers to pin the ends of the device. However, hard bias layers can reduce the sensitivity of the sensor, and have the additional disadvantages of requiring an additional processing layer, etch step and anneal step.

To address the Barkhausen noise problem, a magnetic field may be selectively applied along the easy axis of the sense element prior to performing a measurement. In selected embodiments, the magnetic field is applied as a brief field pulse that is sufficient to restore the magnetic state of the sense element and remove micro-magnetic domains that may have appeared as the result of exposure to a strong field. In an example implementation, a field pulse is applied to a sensor to remove metastable pinned regions in the sense element, where the field pulse has a threshold field strength (e.g., above approximately 40 Oe) and a minimum pulse duration (e.g., of approximately 20-100 nanoseconds). By applying such a field pulse with a predetermined measurement period (e.g., 10 Hz) as required for a compass application, the resulting field pulse has an extremely low duty cycle and minimal power consumption. In addition, by terminating the field pulse prior to measurement, there is no additional field applied to the sense element during measurement, resulting in maximal sensitivity.

Figure 4:
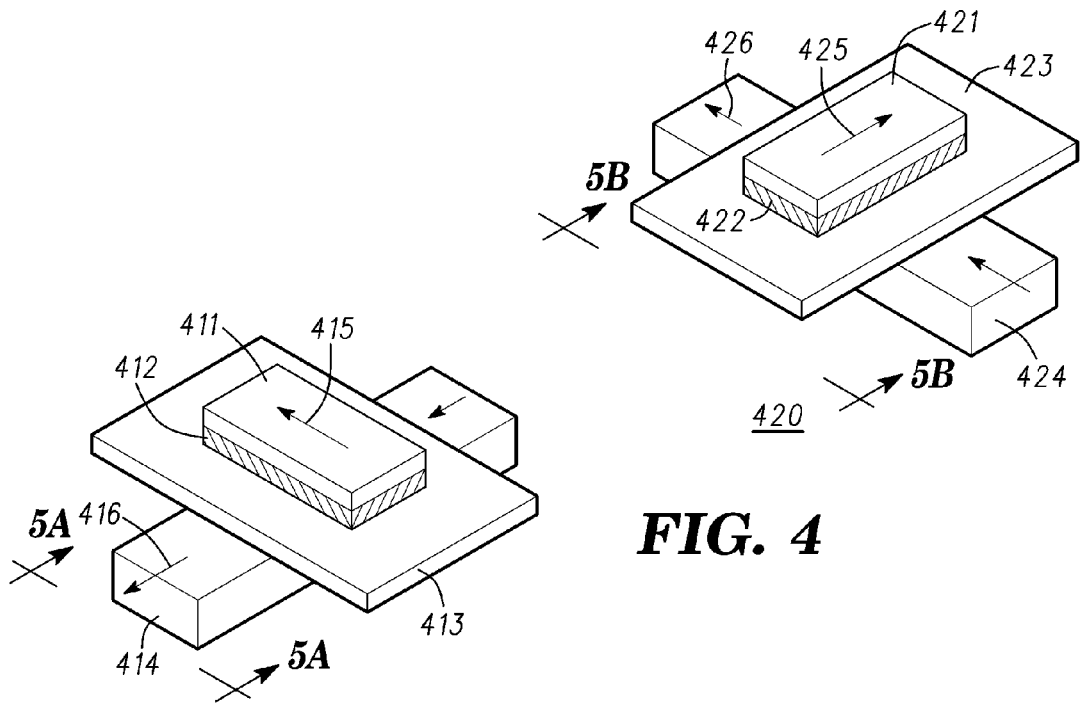
FIG. 4 is a partial schematic perspective view of first and second MTJ sensors which include a magnetic field generator structure for clearing or stabilizing the sense layer prior to or during sense operations.

To illustrate an example of how a field pulse may be applied to a sense element, reference is now made to FIG. 4, which shows a partial schematic perspective view of first and second MTJ sensors 410, 420 which each include a magnetic field generator structure 414, 424 for resetting or stabilizing the sense layer 411, 421 prior to or during sense operations. Each MTJ sensor may be constructed as shown in FIG. 4 where the magnetic direction of the sense layer determines the orientation of the magnetic field generator structure. In particular, each MTJ sensor generally includes an upper ferromagnetic layer 411, 421, a lower ferromagnetic layer 413, 423, and a tunnel barrier layer 412, 422 between the two ferromagnetic layers. In this example, the upper ferromagnetic layer 411, 421 may be formed to a thickness in the range 10 to 10000 Angstroms, and in selected embodiments in the range 10 to 100 Angstroms, and functions as a sense layer or free magnetic layer because the direction of its magnetization can be deflected by the presence of an external applied field, such as the Earth's magnetic field. As for the lower ferromagnetic layer 413, 423, it may be formed to a thickness in the range 10 to 2000 Angstroms, and in selected embodiments in the range 10 to 100 Angstroms, and functions as a fixed or pinned magnetic layer when the direction of its magnetization is pinned in one direction that does not change magnetic orientation direction during normal operating conditions. As described above, the first and second MTJ sensors 410, 420 may be used to construct a differential sensor by forming the lower pinned layers 413, 423 to have the same magnetization direction (not shown), and by forming the magnetization direction 415 in upper sense layer 411 to be orthogonal to the magnetization direction 425 in upper sense layer 421 so that the magnetization directions 415, 425 are oriented in equal and opposite directions from the magnetization direction of the lower pinned layers 413, 423.

To restore the original magnetization of the upper sense layers 411, 421 that can be distorted by magnetic domain structure, FIG. 4 depicts a magnetic field generator structure 414, 424 formed below each sensor. In selected embodiments, the magnetic field generator structure 414, 424 is formed as a conducting current line which is oriented to create a magnetic field pulse which aligns with the magnetization direction 415, 425 in the upper sense layer 411, 421. For example, when a current pulse flows through the magnetic field generator structure 414 below the first MTJ sensor 410 in the direction indicated by the arrow 416, a field pulse is created that is aligned with the easy axis 415 of the sense element 411 in the first MTJ sensor 410. However, since the second MTJ sensor 420 has a sense layer 421 with a different magnetization direction 425, the magnetic field generator structure 424 is oriented so that a field pulse is created that is aligned with the easy axis 425 of the sense element 421 in the second MTJ sensor 420 when a current pulse flows through the magnetic field generator structure 424 in the direction indicated by the arrow 426.

The exemplary embodiments described herein may be fabricated using known lithographic processes as follows. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photo resist material is applied onto a layer overlying a wafer substrate. A photo mask (containing clear and opaque areas) is used to selectively expose this photo resist material by a form of radiation, such as ultraviolet light, electrons, or x-rays. Either the photo resist material exposed to the radiation, or that not exposed to the radiation, is removed by the application of a developer. An etch may then be applied to the layer not protected by the remaining resist, and when the resist is removed, the layer overlying the substrate is patterned. Alternatively, an additive process could also be used, e.g., building a structure using the photo resist as a template.

Various illustrative embodiments of the process integration will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. In addition, selected aspects are depicted with reference to simplified cross sectional drawings without including every device feature or geometry in order to avoid limiting or obscuring the present invention. It is also noted that, throughout this detailed description, conventional techniques and features related to magnetic sensor design and operation, Magnetoresistive Random Access Memory (MRAM) design, MRAM operation, semiconductor device fabrication, and other aspects of the integrated circuit devices may not be described in detail herein. While certain materials will be formed and removed to fabricate the integrated circuit sensors as part of an existing MRAM fabrication process, the specific procedures for forming or removing such materials are not detailed below since such details are well known and not considered necessary to teach one skilled in the art of how to make or use the present invention. Furthermore, the circuit/component layouts and configurations shown in the various figures contained herein are intended to represent exemplary embodiments of the invention. It should be noted that many alternative or additional circuit/component layouts may be present in a practical embodiment.

Figure 5:
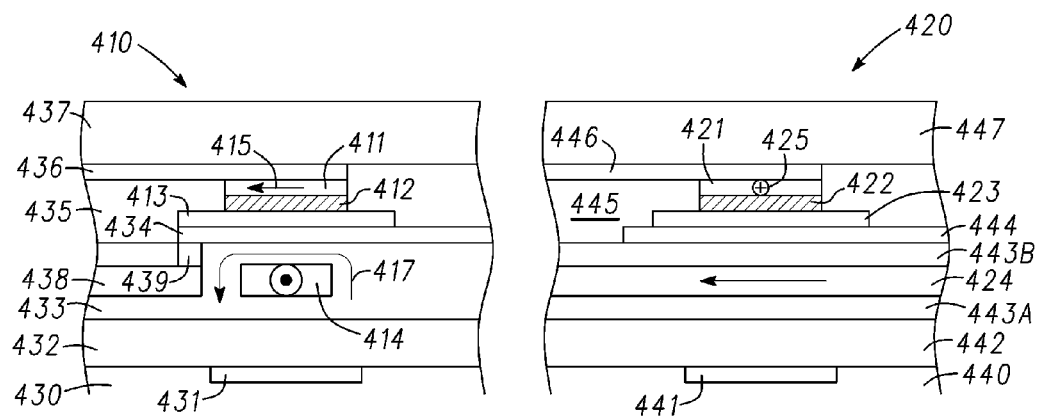
FIG. 5 is a partial cross-sectional view of an integrated circuit in which the first and second MTJ sensors shown in FIG. 4 are formed to have sense layers with different magnetization directions.

The relative alignment of the field pulse and easy axis directions may also be seen in FIG. 5, which depicts a partial cross-sectional view of an integrated circuit device in which the first and second MTJ sensors shown in FIG. 4 are formed to have sense layers 411, 421 with different magnetization directions. In particular, the cross-sectional view on the left shows the first MTJ sensor 410 as seen from the perspective view 5A in FIG. 4, while the cross-sectional view on the right shows the second MTJ sensor 420 as seen from the perspective view 5B in FIG. 4. The first and second MTJ sensors 410, 420 are each formed over a substrate 430, 440 which may have an active circuit 431, 441 embedded therein. On the substrate, one or more circuit layers 432, 442 may be formed before forming an insulating layer 433, 443 in which a conductive line 414, 424 is embedded to form a magnetic field generator structure. As shown in FIG. 5, the conductive line 414 in the first MTJ sensor 410 is formed to carry current in the direction coming out of plane of the drawing of FIG. 5, while the conductive line 424 in the second MTJ sensor 420 is formed to carry current moving right-to-left on the drawing. Over the embedded conductive lines, the first and second MTJ cores are formed in an insulating layer 435, 445. In particular, the first MTJ core in the first MTJ sensor 410 includes a first conductive line 434 at least partially embedded in the insulating layer 435, a lower pinned ferromagnetic layer 413, a tunnel barrier layer 412, an upper sense ferromagnetic layer 411 having a magnetization direction 415 that is oriented right-to-left, and a second conductive line 436 over which is formed an additional dielectric layer 437. The first conductive layer 434 is connected to a bottom contact layer 438 through a via structure 439. In addition, the second MTJ core in the second MTJ sensor 420 includes a first conductive line 444 at least partially embedded in the insulating layer 445, a lower pinned ferromagnetic layer 423, a tunnel barrier layer 422, an upper sense ferromagnetic layer 421 having a magnetization direction 425 that is oriented into the plane of the drawing of FIG. 5, and a second conductive line 446 over which is formed an additional dielectric layer 447. To connect the first and second MTJ sensors 410, 420, the first conductive layer 444 in the second MTJ sensor 420 is connected through a via structure (not shown) to a bottom contact layer (not shown) in the same level as the embedded conductive line 424, which in turn is connected through one or more vias and conductive layers to the second conductive line 436 from the first MTJ sensor 410. With the depicted configuration, current pulses through the embedded conductive line 414 will create a magnetic field pulse 417 which is aligned with the easy axis 415 of the sense element 411, and current pulses through the embedded conductive line 424 will create a magnetic field pulse in the region of the sense element 421 (not shown) which is aligned with the easy axis 425 of the sense element 421.

The lower pinned ferromagnetic layers 413, 423 may be a material, for example, iridium manganese, platinum manganese, cobalt iron, cobalt iron boron, nickel iron, ruthenium, and the like, or any combination thereof. The tunnel barrier layers 412, 422 may be a material, for example, aluminum oxide or magnesium oxide. The upper sense ferromagnetic layers 411, 421 may be a material, for example, nickel iron, cobalt iron, cobalt iron boron, ruthenium, and/or the like. The magnetic field generator structures 414, 424 may be aluminum, copper, tantalum, tantalum nitride, titanium, titanium nitride or the like, while conductive lines in general may be, for example, aluminum, copper, tantalum, tantalum nitride, titanium, titanium nitride or the like.

The first and second MTJ sensors 410, 420 may be fabricated together on a monolithic integrated circuit as part of a differential sensor by forming sense layers 411, 421 having orthogonal magnetic orientations that each differ equally from the magnetic direction of the pinned layers 413, 423. In an example process flow, the first step in the fabrication process is to provide a monolithic integrated circuit chip substrate which is covered by a dielectric base layer (not shown). Over the dielectric base layer, magnetic field generator structures 414, 424 are formed as embedded lines of conductive material using known deposition, patterning and etching processes so that the magnetic field generator structures 414, 424 are aligned and positioned below the sensors 410, 420 and embedded in an insulating layer (not shown). Upon the insulating layer, a stack of sensor layers is sequentially formed by depositing a first conductive layer (to serve after etching as the conductive line 434), one or more lower ferromagnetic layers (to serve after etching as the lower pinned ferromagnetic layer 413), one or more dielectric layers (to serve after etching as the tunnel barrier layer 412), one or more upper ferromagnetic layers (to serve after etching as the upper sense ferromagnetic layer 411), and a second conductive layer (to serve after etching as the conductive line 436).

While the various ferromagnetic layers may each be deposited and heated in the presence of a magnetic field to induce a desired magnetic orientation, shape anisotropy techniques may also be used to achieve the required magnetic orientations for the different ferromagnetic layers. To this end, the sensor layer stack is selectively etched with a sequence of patterned etch processes to define the pinned and sense layers in the MTJ sensors 410, 420. In a first etch sequence, the shapes of the different pinning layers 413, 423 are defined from the lower ferromagnetic layer(s) by using patterned photoresist to form a first patterned hard mask and then performing a selective etch process (e.g., reactive ion etching) to remove all unmasked layers down to and including the unmasked lower ferromagnetic layer(s). The resulting shapes of the etched lower ferromagnetic layers are oriented so that each pinned layer has shape anisotropy, resulting in a preferred magnetic orientation along one of its axes. In addition to being formed as long and narrow shapes, additional shaping of the ends of pinned layers may be provided so that each of the pinned layers performs more like a single magnetic domain. For example, the pinned layers 901, 902, 903, 904 shown in FIG. 9 layers may be shaped to have pointed ends that taper in the corresponding directions of desired pinned direction for the pinned layers. Using shape anisotropy, the shaped pinned layers 413, 423 may be annealed to set their respective pinning directions.

At this point in the fabrication process, the upper ferromagnetic layer(s) will have been selectively etched to leave a remnant portion under the first patterned hard mask so that the upper and lower ferromagnetic layer(s) have the same shape. However, the final shape of the sense layers will be smaller than the underlying pinned layers, and to this end, a second etch sequence is used to define the final shapes of the different sense layers 411, 421 from the remnant portions of the upper ferromagnetic layer(s). In the second etch sequence, another photoresist pattern is used to form a patterned hard mask over the parts of the remnant upper ferromagnetic layer(s) layer that will form the sense layers. The pattern is selected to define high aspect ratio shapes for the sense layers when a selective etch process (e.g., reactive ion etching) is used to remove all unmasked layers down to and including the unmasked upper ferromagnetic layer(s) 411, 421. In selected embodiments, the selective etch process may leave intact the underlying shaped pinned layers 413, 423, though in other embodiments, the selective etch process also etches the unmasked portions of the underlying shaped pinned layers 413, 423. The defined high aspect ratio shapes for the sense layers are oriented so that the sense layers 411 are longer in the dimension of the desired magnetization 415 than they are wide, while the sense layers 421 are longer in the dimension of the desired magnetization 425 than they are wide. In other words, the long axis for each sense layer is drawn along the desired magnetization direction for a single ferromagnetic sense layer. In addition to being formed as long and narrow shapes, additional shaping of the ends of sense layers 411, 421 may be provided so that each of the sense layers performs more like a single magnetic domain. For example, the sense layers may be shaped to have pointed ends that taper in the corresponding directions of desired easy axis for the sense layers. Once the shaped sense layers are formed, the desired easy axis magnetic orientations may be induced from their shape anisotropy by briefly annealing the wafer (e.g., at an anneal temperature of approximately 250 degrees C. in the absence of a magnetic field to remove material dispersions. Upon cooling, the magnetizations of the sense layers 411, 421 align with the individual pattern, providing multiple orientations of sense layers.

Figure 6:
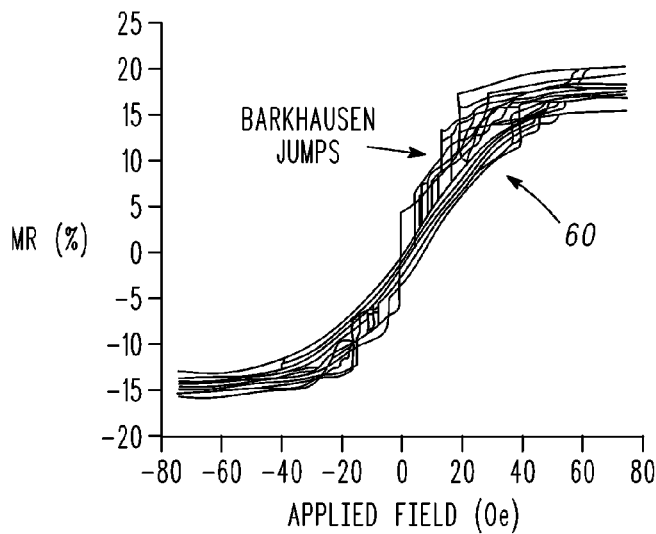
FIG. 6 is an example plot of the magneto-resistance against the applied field when no stabilization field is applied to the sensor.
Figure 7:
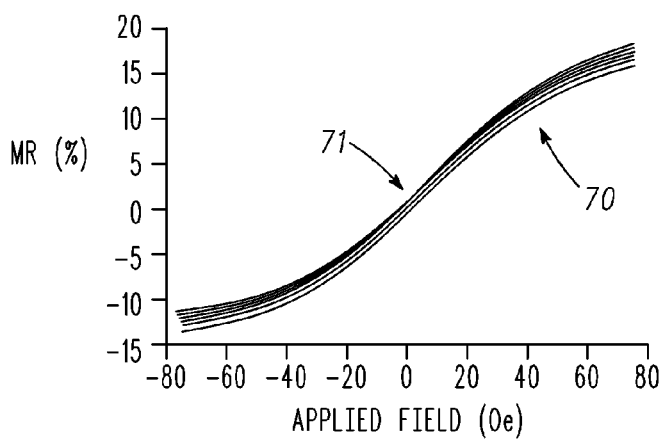
FIG. 7 is an example plot of the magneto-resistance against the applied field when a steady state stabilization field is applied to the sensor.
Figure 8:
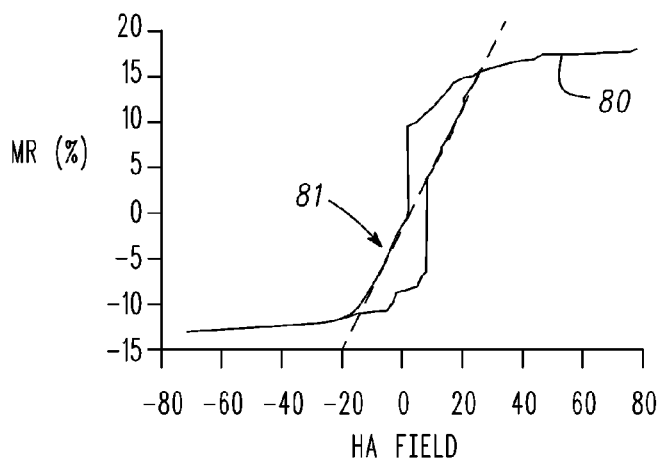
FIG. 8 is an example plot of the magneto-resistance against the applied field when a pre-measurement reset pulse is applied to the sensor.

By controlling the magnitude and timing of the current flow through the magnetic field generator structures 414, 424 so as to create a field pulse just prior to using the sensors 410, 420 to perform a field measurement, the sense layers 411, 421 are prepared before each measurement in a way that maintains high sensitivity and minimizes power consumption. The benefits of selectively applying a magnetic field to the sense elements are demonstrated in FIGS. 6-8. Starting with FIG. 6, there is provided an example plot of the magneto-resistance against the applied field when no stabilization field is applied to the sensor. Without a stabilization field, the micro-magnetic domain jumps cause the transfer curve 60 to have sporadic, unpredictable jumps in magneto-resistance (a.k.a., Barkhausen noise) as an applied field is swept. This noise may be prevented by applying a weak stabilization field in alignment with the easy axis of the sense element. For example, FIG. 7 provides an example plot of the magneto-resistance against the applied field when a 15 Oe easy axis stabilization field is applied as a steady state field to the sensor. As shown in the plot of FIG. 7, the micro-magnetic domain jumps have been eliminated. As a consequence, the transfer curve 70 in this example includes a region of linear characteristics 71 up to an applied field of approximately 20 Oe. In addition or in the alternative, a field pulse may be applied to further improve the transfer curve, as shown in FIG. 8 which provides an example plot 80 of the magneto-resistance against the applied field when a pulsed stabilization field is applied to the sensor. In particular, the transfer curve 80 was obtained by briefly pulsing a sensor element along its easy axis immediately prior to performing a field measurement at the sensor with a sequence of field sweeps, starting with a first sweep from −5 Oe to 5 Oe, and then performing a second sweep from −10 Oe to 10 Oe, and so on. The resulting transfer curve 80 includes a region of linear characteristics 81 up to at least an applied field of approximately 20 Oe. In addition, the transfer curve 80 indicates that poor performance may be created when this sensor is exposed to a hard axis field above approximately 40 Oe. Stated more generally, a strong field applied at an arbitrary direction may put the sense element in a bad state, while a field pulse applied along the sensor easy axis is sufficient to remove domain structure from the sense element.

In a practical deployment, the magnetic field generator structures 414, 424 are formed from the same layer that is necessary to interconnect the bridge legs, and hence creates no additional processing steps. In addition, each of the magnetic field generator structures 414, 424 may be constructed from a single conductive element that is positioned to pass beneath each MTJ sensor with the appropriate orientation, thereby creating field pulses throughout the chip with a single current pulse. An example of such a practical implementation is illustrated with FIG. 9 which provides a simplified schematic top or plan view of a reticle layout showing differential sensor 900 formed with a plurality of series-connected MTJ sensors 921, 922, 923, 924 configured in a Wheatstone bridge circuit with a magnetic field generator structure 920 positioned in relation to the MTJ sensors. The depicted differential sensor includes four pinned layers 901, 902, 903, 904 which each have the same magnetization direction (e.g., a pinned axis in the y-direction), as shown by the large vector arrow on each pinned layer. While the pinned layers 901, 902, 903, 904 may be formed using their shape anisotropy (as indicated in FIG. 9), they may also be formed using a traditional field-anneal process.

Figure 9:
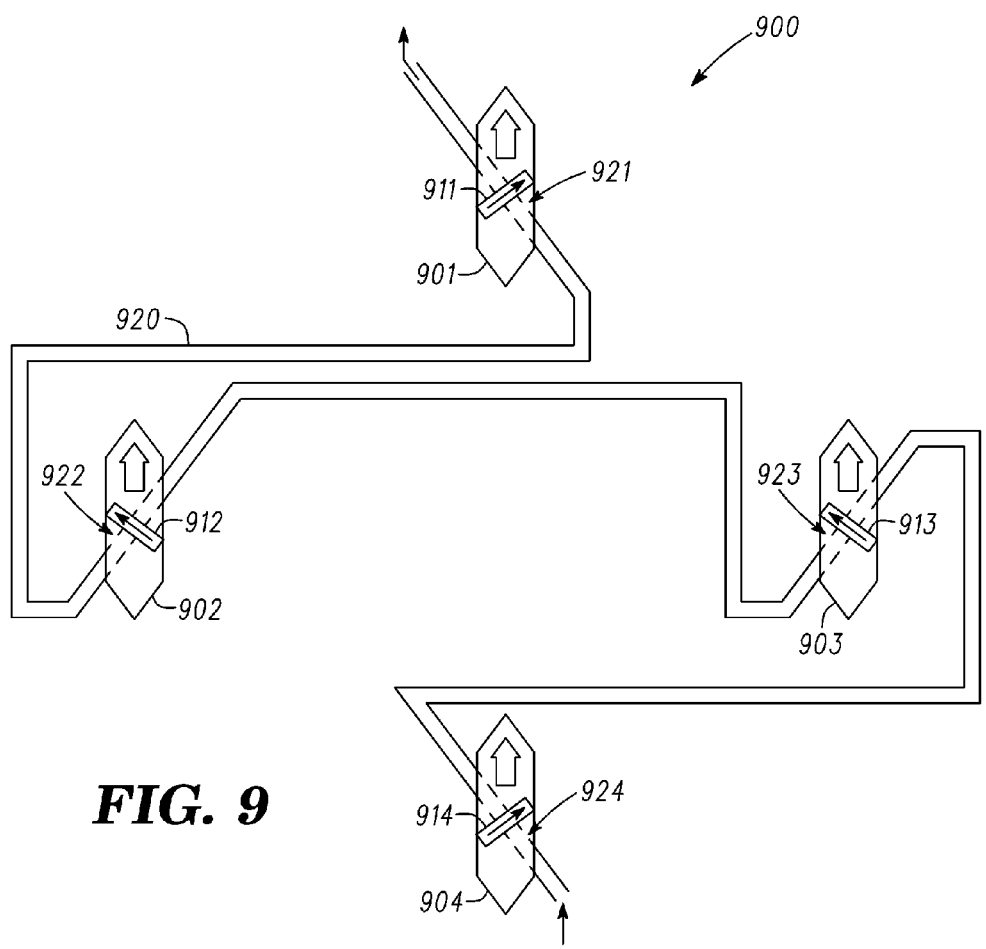
FIG. 9 is a simplified schematic top or plan view of a reticle layout showing differential sensor formed with a plurality of series-connected MTJ sensors configured in a Wheatstone bridge circuit with a magnetic field generator structure positioned in relation to the MTJ sensors.

FIG. 9 also shows that two of the MTJ sensors or sensor arrays, 921, 924 in the differential sensor are formed with sense layers 911, 914 having a magnetization direction that is oriented at 45 degrees from vertical, as shown with the easy axis vector pointing to the right in the sense layers 911, 914. The other two MTJ sensors 902, 903 are formed with sense layers 912, 913 having a magnetization direction that is oriented at negative 45 degrees from vertical, as shown with the easy axis vector pointing to the left in the sense layers 912,

913. While any desired technique may be used to form the sense layers having different magnetization directions, selected embodiments of the present invention use shape anisotropy techniques to shape the sense elements 911, 914 to have a magnetization direction (or easy axis) that is oriented at predetermined deflection angle from vertical, and to shape the sense elements 912, 913 to have a magnetization direction (or easy axis) that is oriented negatively at the predetermined deflection angle from vertical. In this way, the magnetization direction of the sense elements 911, 914 and the magnetization direction of the sense elements 912, 913 are offset equally in opposite directions from the magnetization direction of the pinned layers 901, 902, 903, 904.

The depicted differential sensor 900 also includes a magnetic field generator structure 920 which is formed beneath the MTJ sensors 921, 922, 923, 924 so as to selectively generate a magnetic field to stabilize or restore the magnetic field of the sense layers 911, 912, 913, 914. In selected embodiments, the magnetic field generator structure 920 is formed as a single conductive line which is arranged to carry current beneath the sense layers 911, 912, 913, 914 in a direction that is perpendicular to the easy axis orientation of the sense layers so that the magnetic field created by the current is aligned with the easy axis. Thus, the conductive line 920 is formed below the fourth MTJ sensor 924 to create a magnetic field that is aligned with the easy axis of the sense element 914. In addition, the orientation of the conductive line 920 below the second and third MTJ sensors 922, 923 creates a magnetic field that is aligned with the easy axis of the sense elements 912, 913. Finally, the conductive line 920 is formed below the first MTJ sensor 921 to create a magnetic field that is aligned with the easy axis of the sense element 911.

Figure 10:
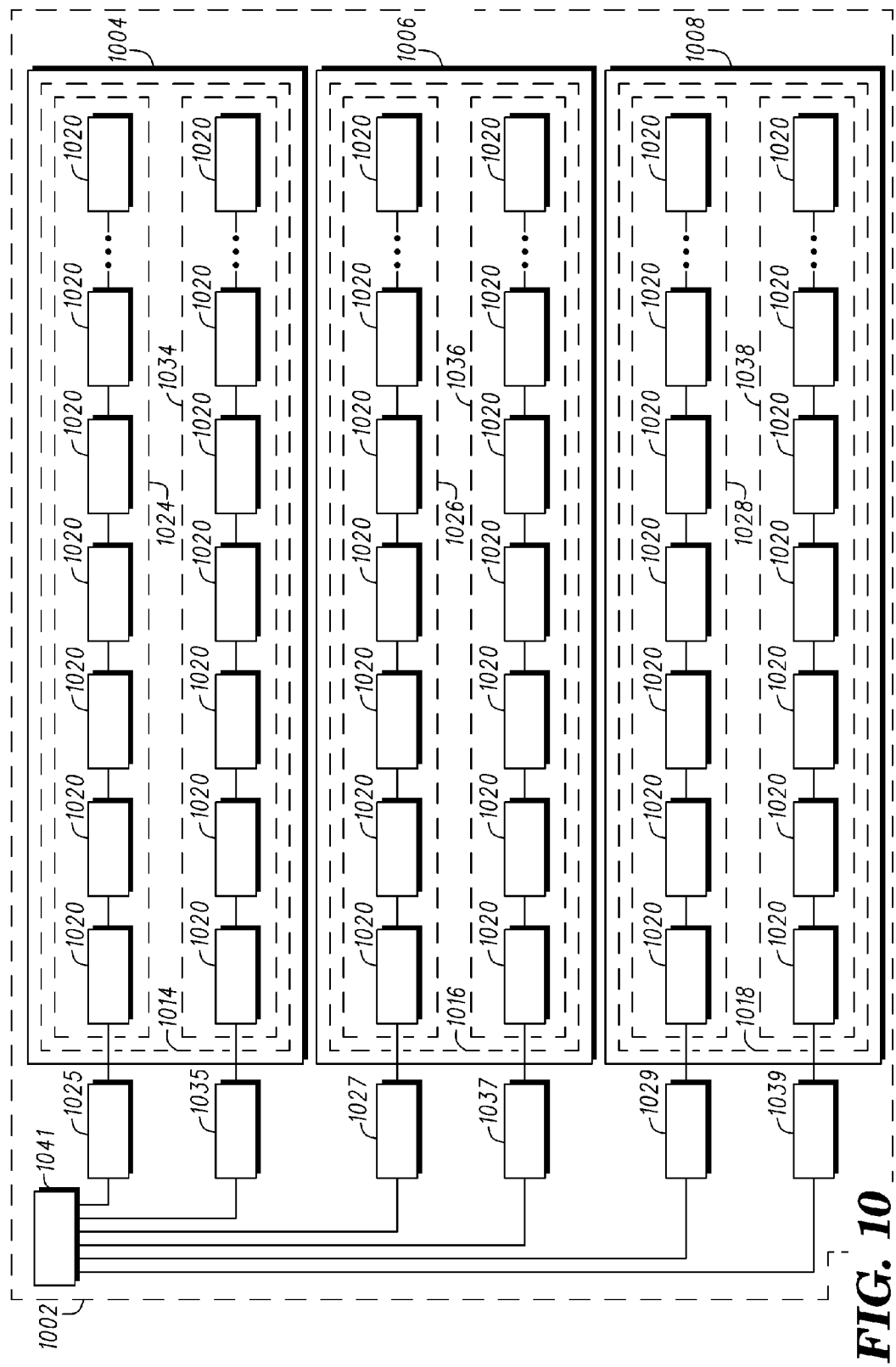
FIG. 10 is a partial block diagram of three Wheatstone bridges configured to receive sequential application of reset pulses for resetting a plurality of MTJ sensors within each bridge.

Referring to FIG. 10, a block diagram of an integrated magnetic sensor 1002 includes the Wheatstone bridge 1004 for sensing a magnetic field in an X direction, a Wheatstone bridge 1006 for sensing a magnetic field in a Y direction, and a Wheatstone bridge 1008 for sensing a magnetic field in a Z direction. While three Wheatstone bridges 1004, 1006, 1008 are shown for sensing a field in three dimensions, it is understood that only one Wheatstone bridge may be formed for sensing a field in one dimension, or two Wheatstone bridges may be formed for sensing a field in two dimensions. One example of a structure for sensing a magnetic field in three dimensions may be found in U.S. patent application Ser. No. 12/567,496. The Wheatstone bridge 1004 includes a first plurality of magnetic elements 1014, including a first group 1024 and a second group 1034. Likewise, Wheatstone bridge 1006 includes a first plurality of magnetic elements 1016, including a first group 1026 and a second group 1036, and Wheatstone bridge 1008 includes a first plurality of magnetic elements 1018, including a first group 1028 and a second group 1038. While two groups are shown in each of the Wheatstone bridges 1004, 1006, 1008, any number of groups numbering two or more may be utilized. For example, the plurality of magnetic elements 1014 may comprise i magnetic elements, the plurality of magnetic elements 1016 may comprise j magnetic elements, and the plurality of magnetic elements 1018 may comprise k magnetic elements. Each of the magnetic elements 1020 within each of the plurality of magnetic elements 1014, 1016, 1018 comprises a magnetic element such as MTJ sensors 410, 420 of FIGS. 4 and 5. A write driver 1025 is configured to provide a current pulse to each of the MTJ elements within the group 1024 and a write driver 1035 is configured to subsequently provide a current pulse to each of the MTJ elements within the group 1034. Likewise, a write driver 1027 is configured to provide a current pulse to each of the MTJ elements within the group 1026 and a write driver 1037 is configured to provide a current pulse to each of the MTJ elements within the group 1036, and a write driver 1029 is configured to provide a sequential current pulse to each of the MTJ elements within the group 1028 and a write driver 1039 is configured to provide a sequential current pulse to each of the MTJ elements within the group 1038.

Logic circuit 1041 sequentially selects write drivers 1025, 1035, 1027, 1037, 1029, 1039, for sequentially providing a reset current pulse to the groups 1024, 1034, 1026, 1036, 1028, 1038, respectively. Since a given voltage is provided, by dividing a reset current line having a large resistance into several reset current line segments each having a smaller resistance, a larger current may be applied to each group of MTJ elements in the groups 1024, 1034, 1026, 1036, 1028, 1038. Also, the reset pulses will be sequential, and a smaller stabilization current will be applied during the measurement. This stabilization current will flow through the entire line and stabilize all sense elements with an identical stabilization field since and the voltage is high enough to supply the required stabilization line over the full line resistance. This embodiment is preferred as power consumption is lowest and small differences in stabilization line resistances will not result in different stabilization fields. However, for higher SNR ratios than are attainable given this stabilization configuration, stabilization current may be applied to different sub groupings of the array in parallel, allowing the possibility of additional stabilization paths (and hence sense element array size increases) within a given sensor.

Figure 11:
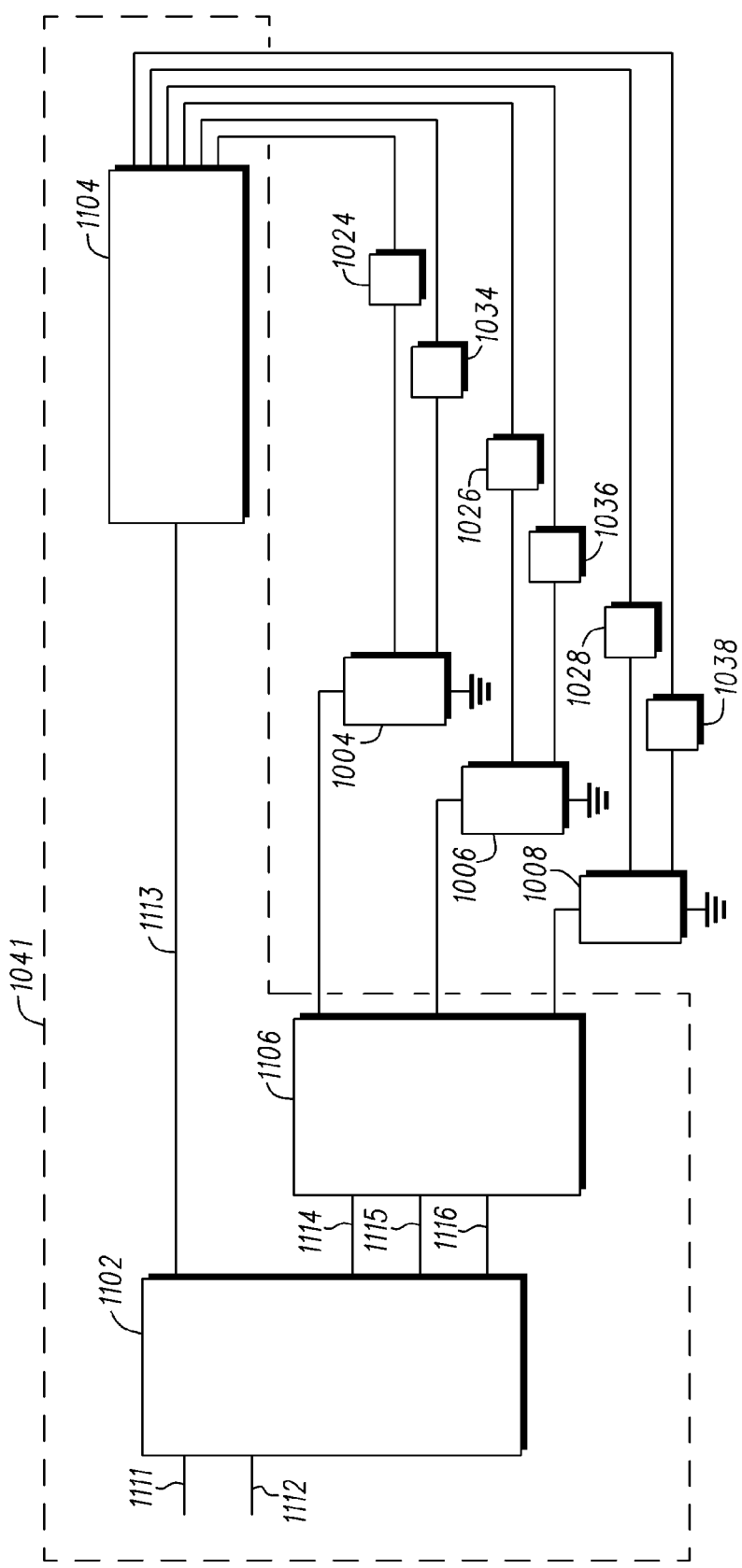
FIG. 11 is a partial block diagram of another three Wheatstone bridges configured to receive sequential resetting pulses for resetting a plurality of MTJ sensors within each bridge and sensing a magnetic field.

The logic circuit 1041 is further described in FIG. 11 and includes a state decoder 1102, a reset circuit 1104, and a read bridge select circuit 1106. Input signals 1111 and 1112 dictate one of four output signals 1113, 1114, 1115, 1116. Output signal 1113 activates the reset circuit 1104 for sequentially activating each of the drivers 1025, 1035, 1027, 1037, 1029, 1039. Output signals 1114, 1115, 1116 activate a read sequence of each of the Wheatstone bridges 1004, 1006, 1008.

Figure 12:
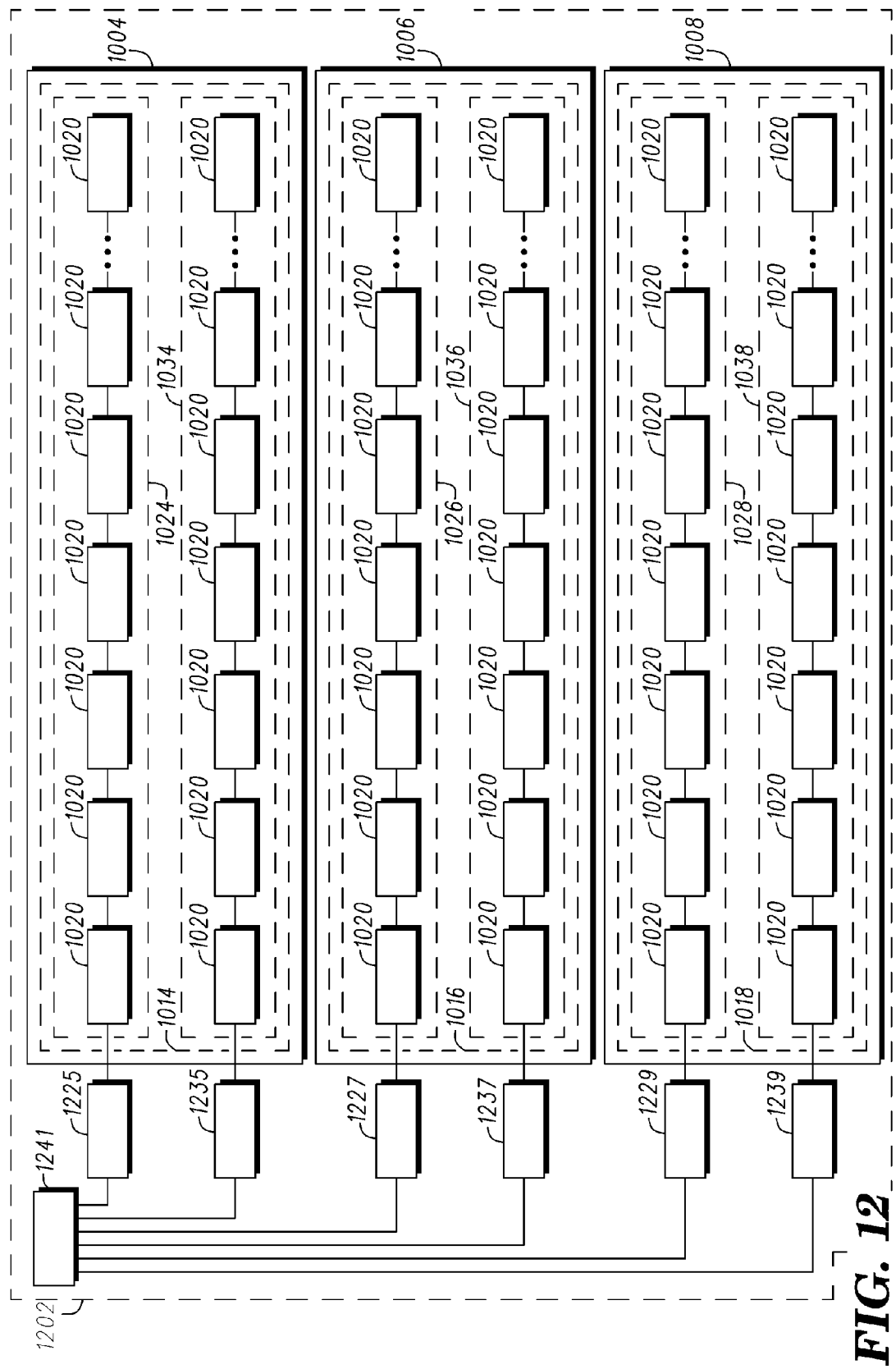
FIG. 12 is a schematic diagram of the circuitry for generating the sequential resetting pulses.

Another magnetic sensor 1202 is shown in FIG. 12 and includes, as in the magnetic sensor 1002 of FIG. 10, the Wheatstone bridge 1004 for sensing a magnetic field in an X direction, a Wheatstone bridge 1006 for sensing a magnetic field in a Y direction, and a Wheatstone bridge 1008 for sensing a magnetic field in a Z direction. The Wheatstone bridge 1004 includes a first plurality of magnetic elements 1014, including a first group 1024 and a second group 1034. Likewise, Wheatstone bridge 1006 includes a first plurality of magnetic elements 1016, including a first group 1026 and a second group 1036, and Wheatstone bridge 1008 includes a first plurality of magnetic elements 1018, including a first group 1028 and a second group 1034. While two groups are shown in each of the Wheatstone bridges 1004, 1006, 1008, any number of groups numbering one or more may be utilized.

A plurality of pads 1225, 1235, 1227, 1237, 1229, 1239 are coupled for providing the current pulses to each of the groups 1024, 1034, 1026, 1036, 1028, 1038, of magnetic elements, respectively. A logic and driver circuit 1241, positioned off-chip for example, provides current pulses to the pads 1225, 1235, 1227, 1237, 1229, 1239 sequentially, in a similar manner to the structure of FIG. 9.

Figure 13:
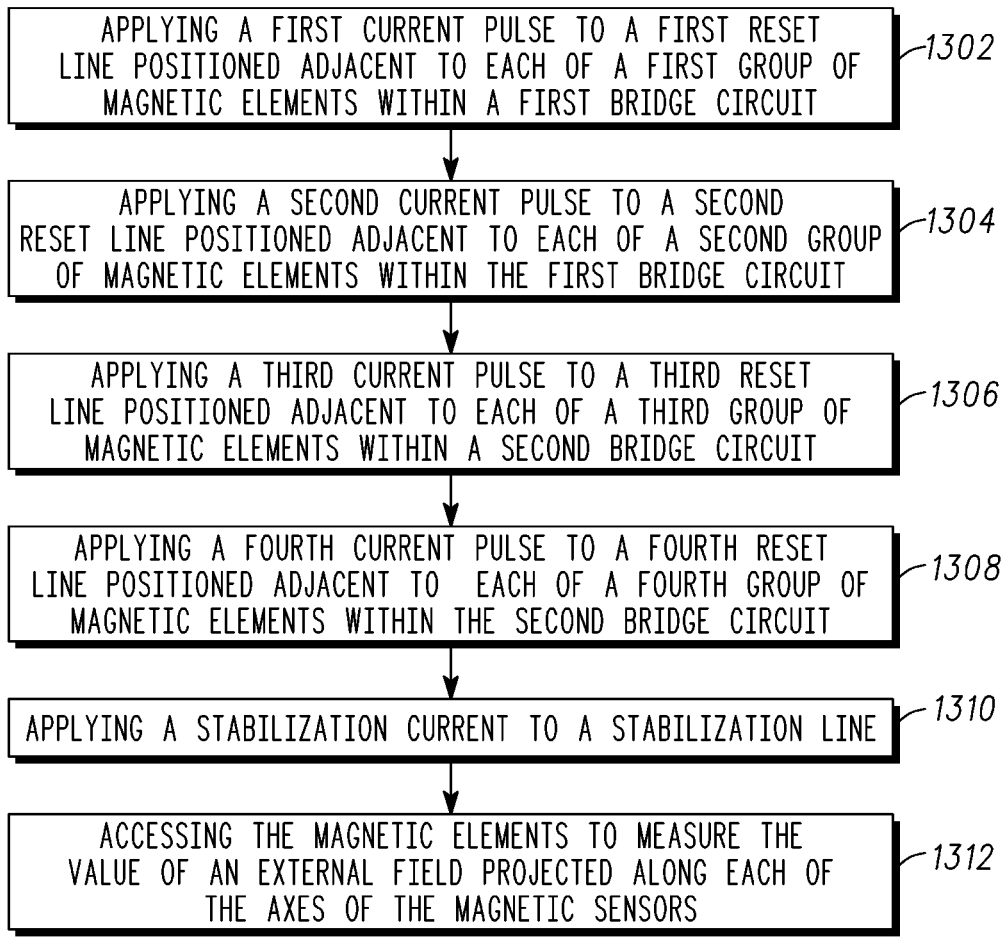
FIG. 13 is a flowchart showing a method of sequentially resetting the MTJ field sensors which may be used to provide initialize magnetic field sensing elements.

Operation of the magnetic sensors 1002, 1202 described herein may also be illustrated with reference to FIG. 13, which depicts an exemplary flowchart for a method of operation of magnetic field sensors which do not exhibit micromagnetic structure by resetting the magnetic elements prior to or just after sensing of an external magnetic field. While two bridge circuits are described, it is understood than any number of bridge circuits may be utilized. This resetting, or initializing, includes the steps of applying 1302 a first current pulse to a first reset line positioned adjacent each of a first group of magnetic elements within a first bridge circuit, applying 1304 a second current pulse to a second reset line positioned adjacent each of a second group of magnetic elements within the first bridge circuit, applying 1306 a third current pulse to a third reset line positioned adjacent each of a third group of magnetic elements within a second bridge circuit, and applying 1308 a fourth current pulse to a fourth reset line positioned adjacent each of a fourth group of magnetic elements within the second bridge circuit. A stabilization current is applied 1310 to the stabilization line. The magnetic elements are then accessed 1312 to measure a value of an external field projected along each of the sensor axes of the magnetic elements.

By now it should be appreciated that there has been provided a magnetic field sensor apparatus and a method of operating a plurality of differential sensor circuits over a substrate which detects an applied magnetic field directed along one or more axis. The differential sensor circuits may be constructed as Wheatstone bridge structures, one for each axis to be sensed, of unshielded magnetic tunnel junction (MTJ) sensors formed with a plurality of pinned layers that are each magnetized in a single pinned direction and a corresponding plurality of unshielded sense layers. In an example implementation, the differential sensor circuit includes a first unshielded MTJ sensor having a first unshielded sense layer with a first easy axis magnetic orientation, and a second unshielded MTJ sensor having a second unshielded sense layer with a second easy axis magnetic orientation, where the first and second easy axis magnetic orientations are deflected equally and in opposite directions (e.g., +45 degrees) from the single pinned direction. When each unshielded sense layer is formed to have an anisotropic axis with a longer length dimension and a shorter width dimension, the longer length dimension is aligned with an easy axis magnetic orientation for the unshielded sense layer. Each magnetic field sensor includes an embedded magnetic field generator disposed near each unshielded sense layer that is positioned to generate a magnetic field pulse that is aligned with an easy axis magnetic orientation for each unshielded sense layer. In selected embodiments, the embedded magnetic field generator is implemented as a conductive line positioned to conduct a current pulse that creates a magnetic field pulse for resetting a magnetic orientation of an associated unshielded sense layer, and/or to apply a weak magnetic field along an easy axis magnetic orientation for each unshielded sense layer. The sense layers and conductive lines within each magnetic field sensor are grouped, wherein each group sequentially receives a current pulse. By providing a current pulse sequentially to these groups, the line resistance during the orienting current pulse is reduced, allowing for a larger current with the given voltage.

Although the described exemplary embodiments disclosed herein are directed to various sensor structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the relative positions of the sense and pinning layers in a sensor structure may be reversed so that the pinning layer is on top and the sense layer is below. Also the sense layers and the pinning layers may be formed with different materials than those disclosed. Moreover, the thickness of the described layers may vary. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A field sensor comprising:
   a first bridge circuit including a first plurality of magnetic sense elements configured to sense a field in a first dimension, the first plurality of magnetic sense elements including i groups of magnetic sense elements where i is greater than or equal to 2, and wherein each group includes a plurality of magnetic sense elements having a same function; and
   circuitry configured to apply a current pulse, the current pulse sequentially applied adjacent to each of the i groups of the plurality of magnetic sense elements, wherein the sequential application of current pulses adjacent to the i groups of the plurality of magnetic sense elements results in a larger current applied adjacent to each of the i groups, for a given voltage, than if the current pulse had been applied adjacent to all of the first plurality of magnetic sense elements simultaneously.

2. The field sensor of claim 1 further comprising:
   a second bridge circuit including a second plurality of magnetic sense elements configured to sense the field in a second dimension, the second plurality including j groups of magnetic sense elements where j is greater than or equal to 2, each of the second plurality of magnetic sense elements having the same function as each of the first plurality of magnetic sense elements, wherein the circuitry is configured to sequentially apply the current pulse adjacent each of the i and j groups, wherein the sequential application of the current pulse to each of the i and j groups results in a larger current applied adjacent to each of the i and j groups, for a given voltage, than if the current pulse had been applied adjacent to all of the first and second plurality of magnetic sense elements simultaneously.

3. The field sensor of claim 2 further comprising:
   a third bridge circuit including a third plurality of magnetic sense elements configured to sense the field in a third dimension, the third plurality including k groups of magnetic sense elements where k is greater than or equal to 2, each of the third plurality of magnetic sense elements having the same function as each of the first plurality of magnetic sense elements, wherein the circuitry is configured to sequentially apply the current pulse adjacent each of the i, j, and k groups, wherein the sequential application of the current pulse to each of the i, j, and k groups results in a larger current applied adjacent to each of the i, j, and k groups, for a given voltage, than if the current pulse had been applied adjacent to all of the first, second, and third plurality of magnetic sense elements simultaneously.

4. The field sensor of claim 1 wherein the circuitry comprises:
   a logic circuit;
   i current driver circuits configured to each sequentially apply the current pulse adjacent to one of the i groups of magnetic sense elements in response to the output of the logic circuit.

5. The field sensor of claim 2 wherein the circuitry comprises:
   a logic circuit;
   i+j current driver circuits configured to each sequentially apply the current pulse adjacent to each of the i+j groups of magnetic sense elements, in response to the output of the logic circuit.

6. The field sensor of claim 3 wherein the circuitry comprises:
   a logic circuit;
   i+j+k current driver circuits configured to each sequentially apply a current pulse adjacent to each of the i+j+k groups of magnetic sense elements in response to the output of the logic circuit.

7. The field sensor of claim 1 wherein the circuitry comprises:
   a first contact pad configured to receive a first current pulse and apply the first current pulse adjacent to one of the i groups; and
   a second contact pad configured to receive a second current pulse and apply the second current pulse adjacent to another of the i groups.

8. The field sensor of claim 1 wherein the first bridge circuit comprises:
   a first magnetic tunnel junction sensor having a first unshielded sense layer with a first easy axis magnetic orientation; and
   a second magnetic tunnel junction sensor having a second unshielded sense layer with a second easy axis magnetic orientation.

9. The field sensor of claim 8:
   wherein the first and second easy axis magnetic orientations are deflected equally and in opposite directions from a pinned direction when not exposed to a magnetic field.

10. A field sensor comprising:
    a first bridge circuit including a first plurality of magnetic sense elements configured to sense a field in a first direction, the first plurality of magnetic sense elements including at least a first and second group of magnetic sense elements, each of the first plurality of magnetic sense elements having a same function;
    a first conductive line positioned adjacent the first group;
    a second conductive line positioned adjacent the second group;
    a second bridge circuit including a second plurality of magnetic sense elements configured to sense the field in a second direction, the second plurality including at least a third and fourth group of magnetic sense elements;
    a third conductive line positioned adjacent the third group;
    a fourth conductive line positioned adjacent the fourth group;
    a third bridge circuit including a third plurality of magnetic sense elements configured to sense a field in a third direction, the third plurality including at least a fifth and sixth group of magnetic sense elements;
    a fifth conductive line positioned adjacent the fifth group;
    a sixth conductive line positioned adjacent the sixth group; and
    circuitry configured to apply a current pulse sequentially to each of the first through sixth conductive lines and thereby configuring the field sensor for measurement of the components of the field in the first, second, and third directions, wherein the sequential application of the current pulse to each of the first, second, third, fourth, fifth, and sixth groups results in a larger current applied adjacent to each of the first, second, third, fourth, fifth, and sixth groups, for a given voltage, than if the current pulse had been applied adjacent to all of the first plurality of magnetic sense elements simultaneously.

11. The field sensor of claim 10 wherein the circuitry is further configured to apply a stabilization current to each of the first through sixth conductive lines.

12. The field sensor of claim 10 wherein the circuitry is further configured to apply pulses to at least two of the groups simultaneously to configure the sensor for measurement of the components of the field in each of the first, second, and third directions.

13. The field sensor of claim 10, further comprising additional circuitry and algorithms configured to detect an error condition in an output of the field sensor, wherein the error condition is at least one of the error conditions selected from the group:
    output of one of the bridges being greater than the maximum possible signal as specified by its linear range;
    noisy first, second, or third bridge response; and
    linearity errors in first, second, or third bridge response along one or more axis resulting in a strong deviation from a circular response to rotation in a fixed field.

14. The field sensor of claim 13 further comprising further circuitry to issue an orienting field pulse when one or more of the error conditions is detected.

15. A method of resetting a field sensor, comprising:
    applying a first current pulse to a first reset line positioned adjacent each of a first group of magnetic sense elements within a first bridge circuit; and
    subsequently applying a second current pulse to a second reset line positioned adjacent each of a second group of magnetic sense elements within the first bridge circuit, each of the first and second group of magnetic sense elements having a same function, wherein the sequential application of the first and second current pulses results in a larger current applied adjacent to each of the first and second groups, for a given voltage, than if the current pulse had been applied adjacent to all of the first plurality of magnetic sense elements simultaneously.

16. The method of claim 15 further comprising:
    applying a third current pulse to a third reset line positioned adjacent each of a third group of magnetic sense elements within a second bridge circuit; and
    subsequently applying a fourth current pulse to a fourth reset line positioned adjacent each of a fourth group of magnetic sense elements within the second bridge circuit, each of the third and fourth group of magnetic sense elements having a same function, wherein the sequential application of the third and fourth current pulses results in a larger current applied adjacent to each of the third and fourth groups, for a given voltage, than if the current pulse had been applied adjacent to all of the magnetic sense elements simultaneously.

17. The method of claim 16 further comprising:
applying a fifth current pulse to a fifth reset line positioned adjacent each of a fifth group of magnetic sense elements within a third bridge circuit; and
subsequently applying a sixth current pulse to a sixth reset line positioned adjacent each of a sixth group of magnetic sense elements within the third bridge circuit, each of the third and fourth group of magnetic sense elements having a same function, wherein the sequential application of the fifth and sixth current pulses results in a larger current applied adjacent to each of the fifth and sixth groups, for a given voltage, than if the current pulse had been applied adjacent to all of the magnetic sense elements simultaneously.

18. The method of claim 15 further comprising:
applying a stabilization current adjacent the first and second group; and
measuring the sensor response to the components of a field along a first direction.

19. The method of claim 16 further comprising:
applying a stabilization current adjacent the third and fourth groups; and
measuring the sensor response to the components of a field along a second direction.

20. The method of claim 17 further comprising:
applying a stabilization current adjacent the fifth and sixth groups; and
measuring the sensor response to the components of a field along a third direction.

21. The method of claim 15 wherein the applying first and second current pulses comprise applying first and second current pulses of 50 nanoseconds or less.

* * * * *